(12) United States Patent
Lin et al.

(10) Patent No.: US 6,593,180 B1
(45) Date of Patent: Jul. 15, 2003

(54) METHOD OF MANUFACTURING SEMICONDUCTOR DEVICE

(75) Inventors: Jun Lin, Kawasaki (JP); Yoshiaki Fukuzumi, Yokohama (JP)

(73) Assignees: Fujitsu Limited, Kawasaki (JP); Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/708,044

(22) Filed: Nov. 8, 2000

(30) Foreign Application Priority Data

Nov. 12, 1999 (JP) .......................... 11-322521

(51) Int. Cl.⁷ ........................................ H01L 21/8242
(52) U.S. Cl. ..................... 438/239; 438/240; 438/308
(58) Field of Search .................. 438/239, 240, 438/308

(56) References Cited

U.S. PATENT DOCUMENTS 5,283,214 A * 2/1994 Knudsen

FOREIGN PATENT DOCUMENTS

JP 11-67905 3/1999

* cited by examiner

*Primary Examiner*—Long Pham
(74) *Attorney, Agent, or Firm*—Armstrong, Westerman & Hattori, LLP

(57) ABSTRACT

A method of manufacturing semiconductor device comprises the step of forming the transistor in the semiconductor substrate, the step of forming the capacitor conducting to the transistor, and the step of forming the insulating film to cover the transistor and the capacitor; and the step of sintering the semiconductor substrate in an atmosphere including the mixture of hydrogen, nitrogen and oxygen gases.

13 Claims, 14 Drawing Sheets

SINTERING A

SINTERING B

SINTERING C

SINTERING D

SINTERING A

SINTERING B

SINTERING C

SINTERING D

METHOD OF MANUFACTURING SEMICONDUCTOR DEVICE

BACKGROUND OF THE INVENTION

1. Field of the Invention

The present invention relates to a method of manufacturing a semiconductor device and more particularly a method of manufacturing a semiconductor device having a transistor and a capacitor.

2. Description of the Prior Art

Normally, the semiconductor memory device includes memory cells. Each of the memory cells has a transistor and a capacitor connected to the transistor.

There have been demands for the next generation memory device, e.g., the gigabit DRAM, to have the capacitor being minuter size and higher capacitance.

In order to form the capacitor having such structure, dielectric material such as tantalum oxide ($Ta_2O_5$), barium-strontium-titanate (($Ba,Sr)TiO_3$), lead-zirconate-titanate ($Pb(Zr_xTi_{1-x})O_3$), or the like is employed. In addition, new electrode material such as strontium ruthenate ($SrRuO_3$) may be employed.

However, there is the problem that the capacitor employing such dielectric material and such electrode material is easily degraded in the sintering using the forming gas.

For example, in DRAM, after the formations of transistor, the capacitor, the wirings, the protection insulating film, etc., the sintering, i.e., heating the semiconductor substrate at the temperature of 400 to 450° C. in the atmosphere of the forming gas is carried out to improve the characteristics of the transistor. Such forming gas is a mixture of hydrogen and nitrogen gases and contains the hydrogen gas at a capacity ratio of 3 to 5%. The sintering time is several tens minutes to several hours.

The sintering conducted under such conditions can improve the transistor characteristics, but causes such a problem that the dielectric material or the electrode material is degraded to thus increase the leakage current of the capacitor.

In Patent Application Publication (KOKAI) Hei 11-67905, for example, the sintering employing the forming gas is the process which is normally carried out in the semiconductor device regardless of the presence of the capacitor.

SUMMARY OF THE INVENTION

It is an object of the present invention to provide a manufacturing method of a semiconductor device including the sintering step which never degrades the characteristic of a capacitor.

According to the present invention, as is evident from the experiment, the sintering gas employed to improve the characteristic of the transistor formed on the semiconductor substrate is a mixture of nitrogen, hydrogen, and oxygen gases, the degradation of the capacitor formed on the semiconductor substrate seldom occurs.

It is preferable that the oxygen gas in the atmosphere in which the semiconductor substrate is placed at the time of sintering should be set to 0.01% to 5.0%. And, at the time of sintering, it is preferable that the heating temperature of the substrate is set to 300 to 600° C.

DESCRIPTION OF THE PREFERRED EMBODIMENT

Therefore, an embodiment of the present invention will be explained with reference to the accompanying drawings hereinafter.

Figure 1:
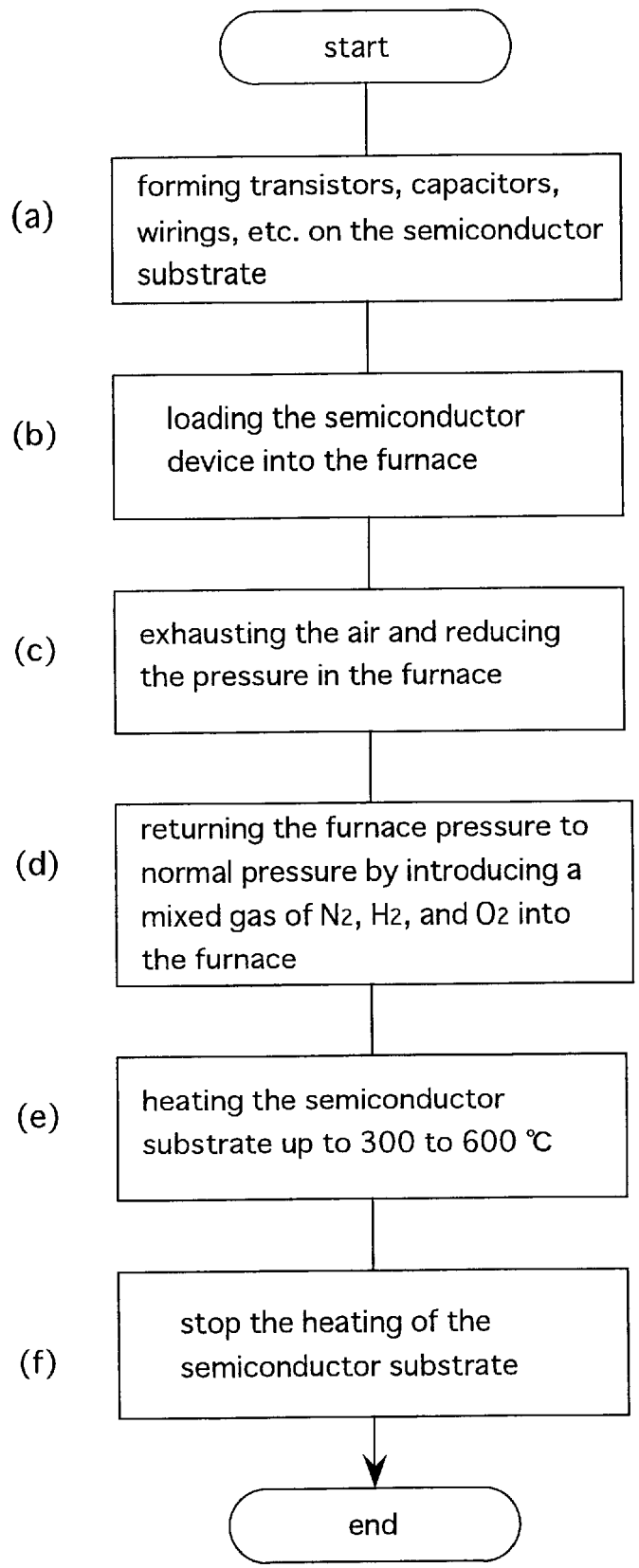
FIG. 1 is a flowchart showing a method of manufacturing a semiconductor device according to an embodiment of the present invention.

FIG. 1 is a flowchart showing steps of manufacturing a semiconductor device according to an embodiment of the present invention.

First, as shown in (a) in FIG. 1, the transistor is formed on the semiconductor substrate and then the capacitor, wirings, and an insulating film are formed on the semiconductor substrate.

Figure 2:
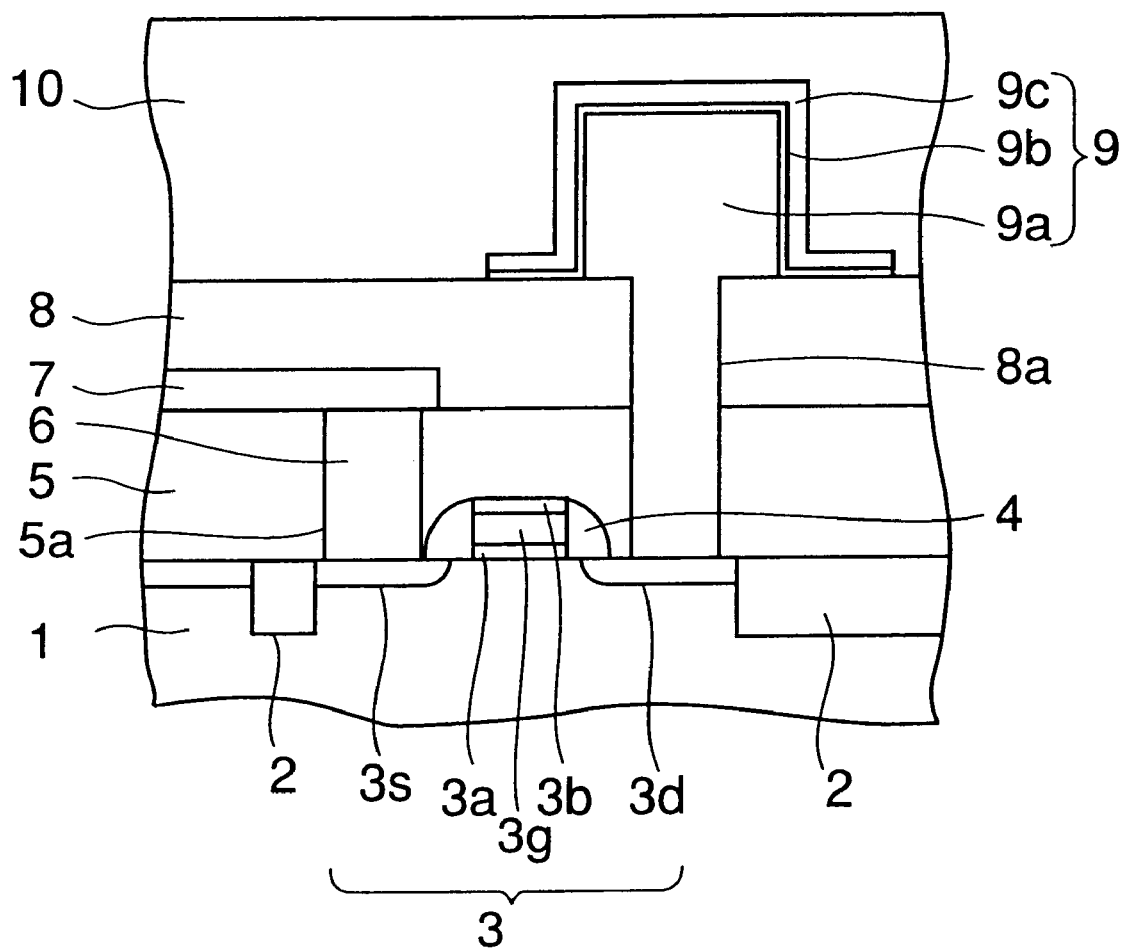
FIG. 2 is a sectional view showing an example of a structure of the semiconductor device according to an embodiment of the present invention.

A part of the semiconductor device formed as above has a structure as shown in FIG. 2.

In FIG. 2, an MOS transistor 3 is formed in the transistor region of a p-type silicon (semiconductor) substrate 1, which is partitioned by a device isolation layer 2.

The MOS transistor 3 has a gate electrode 3g which is formed on the silicon substrate 1 via a gate insulating film 3a formed of the silicon dioxide ($SiO_2$). the gate electrode 3g has a double-layered structure consisting of an doped polysilicon and a tungsten silicide in order, for example. A protection insulating film 3b made of silicon nitride or silicon oxide is formed on the gate electrode 3g.

N-type impurity diffusion layers 3s, 3d serving as source and drain of the MOS transistor are formed in the silicon substrate 1 on both sides of the gate electrode 3g. In addition, insulating sidewalls 4 are formed on side surfaces of the gate electrode 3g. Such insulating sidewalls 4 are employed in forming the n-type impurity diffusion layers 3s, 3d as an LDD structure or in forming the silicide layer on the n-type impurity diffusion layers 3s, 3d.

The MOS transistor having such structure is covered with a first interlayer insulating film 5 such as $SiO_2$, PSG, etc. A first contact hole 5a is formed in the first interlayer insulating film 5 on the n-type impurity diffusion layer 3s of the MOS transistor 3. A plug 6 formed of tungsten is filled into the first contact hole 5a. A bit line 7 which is connected to the n-type impurity diffusion layer 3s via the plug 6 is formed on the first interlayer insulating film 5.

The bit line 7 and the first interlayer insulating film 5 are covered with a second interlayer insulating film 8 formed of $SiO_2$.

A storage electrode 9a of the capacitor 9, which is formed of amorphous silicon containing the n-type impurity, is formed on the second interlayer insulating film 8. This storage electrode 9a is connected to the n-type impurity diffusion layer 3d of the MOS transistor 3 via a second contact hole 8a which is formed in the first interlayer insulating film 5 and the second interlayer insulating film 8. The storage electrode may be made of $SrRu_xO_y$, $RuO_2$, Ru, and $TiO_xN_y$.

In addition, a dielectric film 9b is formed on a surface of the storage electrode 9b. The dielectric film 9b is formed of any one of tantalum oxide ($Ta_2O_5$), barium-strontium titanate (BST; (Ba, Sr)$TiO_3$), PZT (lead titanate zirconate; (Pb($Zr_xTi_{1-x}$)$O_3$), strontium titanate (STO), PLZT, niobium oxide ($Nb_2O_5$), and tantalum titanate ($TaTi_xO_y$). In this case, when the above oxide is used as the dielectric film 9b, the process of improving the crystal property of the dielectric film 9b is performed by annealing the dielectric film 9b in the oxygen atmosphere at 600° C. to 750° C. after the oxide has been formed.

Further, an opposing electrode (cel plate) 9c which is formed of any one of strontium ruthenate (SRO; $SrRu_xO_y$), ruthenium oxide ($RuO_2$), ruthenium (Ru), titanium oxide nitride ($TiO_xN_y$), titanium nitride (TiN), tungsten nitride ($WN_x$), and platinum is formed on the dielectric film 9b.

The capacitor consists of the opposing electrode 9a, the dielectric film 9b, and the opposing electrode 9c.

Such capacitor is covered with a third interlayer insulating film 10.

The above semiconductor device shows the cell region of the DRAM. However, the semiconductor device applied to the present embodiment is not limited to the DRAM, and may be applied to FeRAM, other electronic devices.

After such semiconductor device has been formed, as shown in (b) in FIG. 1, the silicon substrate 1 is conveyed into the heating furnace. Then, characteristics of the transistor 3 are improved by sintering the silicon substrate 1 in the furnace according to the method described in the following.

Figure 3:
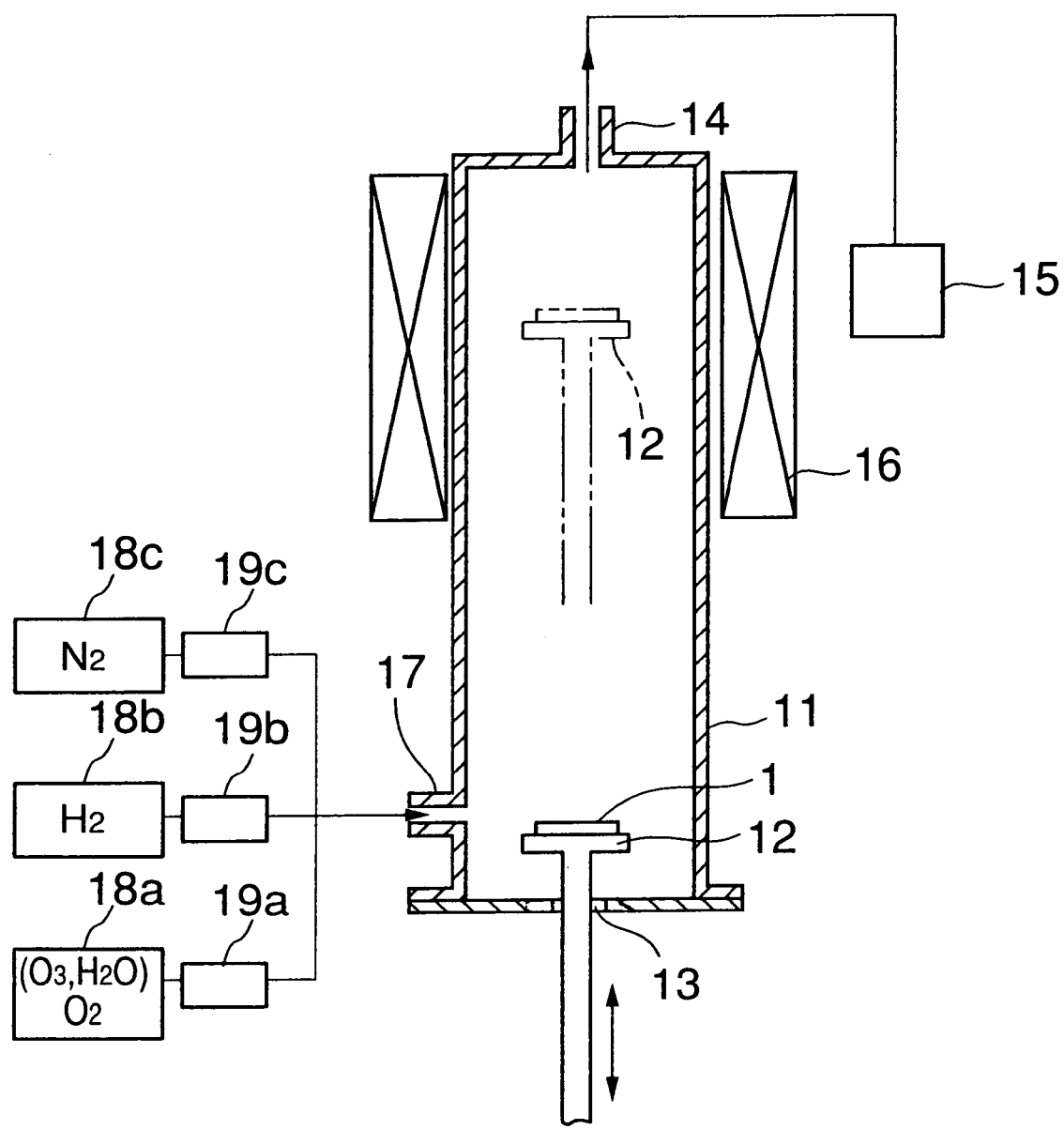
FIG. 3 is a view showing a configuration of an example of a heating furnace employed in the sintering of the semiconductor device according to the embodiment of the present invention.

Such sintering is carried out by using the vertical heating furnace shown in FIG. 3, for example. In FIG. 3, an opening 13 to take a supporting table for substrate 12 in and out is formed at the bottom end of the furnace 11. Then, a gas exhaust port 14 is formed at the top end of the furnace 11. An exhaust pump 15 is connected to the exhaust port 14. Also, a heater 16 for heating the upper area of the furnace 11 is attached around the upper portion of the furnace 11. Further, a gas introducing port 17 for introducing the gas from the outside is provided to the lower portion of the furnace 11. An oxygen supply source 18a, a hydrogen supply source 18b, and a nitrogen supply source 18c are connected to the gas introducing port 17 via first, second, and third mass flow controllers 19a, 19b, 19c respectively.

When the sintering is carried out, as shown in (c) of FIG. 1, first the pressure in the inside of the furnace 11 is reduced into vacuum by using a vacuum pump 15 after the silicon substrate 1 has been conveyed in the lower portion of the furnace 11. Then, as shown in (d) of FIG. 1, nitrogen ($N_2$), hydrogen ($H_2$), and oxygen ($O_2$) are introduced from the oxygen supply source 18a, the hydrogen supply source 18b, and the nitrogen supply source 18c into the furnace 11 so as to return the pressure in the furnace 11 to the atmospheric pressure.

An oxygen containing amount in the mixed gas is set in the range of 0.01% to 5% to a total amount of the mixed gas.

Next, the silicon substrate 1 is moved into a space, which is surrounded by the heater 16, by lifting the supporting table 12 placed in the furnace 11. Then, as shown in (e) of FIG. 1, the sintering is carried out by heating the silicon substrate 1, which is placed in the mixed gas atmosphere, up to the temperature in the range of 300° C. to 600° C. for the time range of 90 to 10 minutes. For example, when the temperature is set 300° C., the times is set 90 minutes, or when the temperature is set 600° C., the times is set 10 minutes.

After the sintering has been finished, as shown in (f) of FIG. 1, the supporting table for substrate 12 is moved downward and the heating of the silicon substrate 1 is stopped.

With the above sintering step, the characteristic of the MOS transistor 3 on the silicon substrate 1 is improved and also the increase in the leakage current and the electrode abnormality are restrained in the capacitor 9, whereby the excellent capacitor characteristic is achieved.

Next, the sintering method according to the present embodiment will be explained while comparing with the sintering method in the prior art.

First, the sintering method in the prior art will be discussed.

Figure 4:
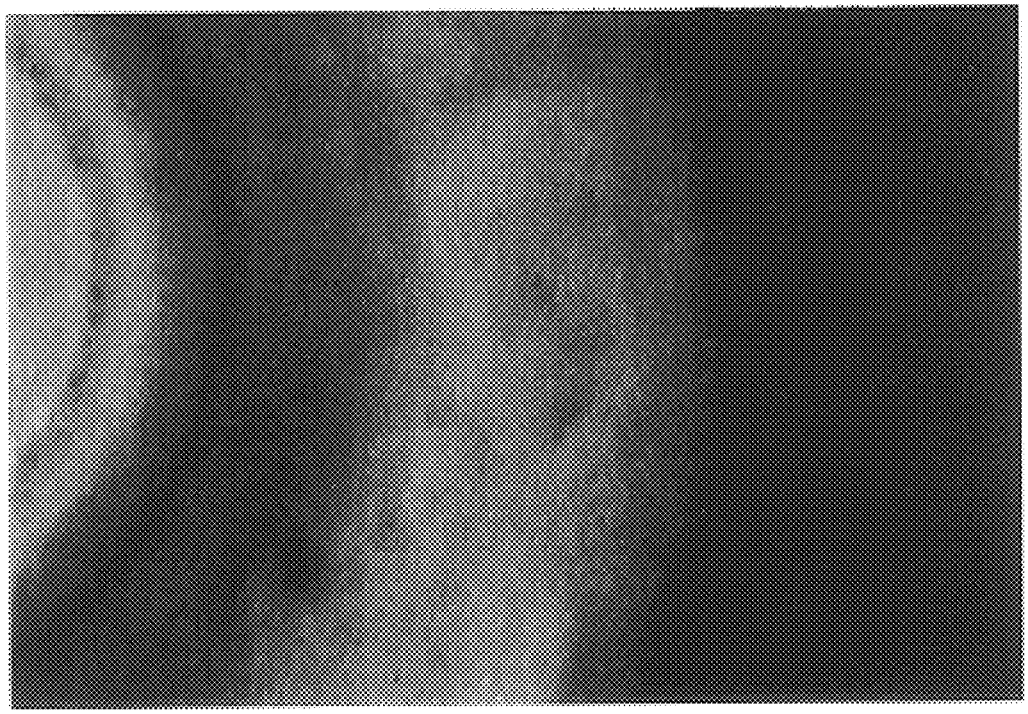
FIG. 4 is a microphotograph showing a surface state of a capacitor opposing electrode after the sintering in the prior art.
Figure 5:
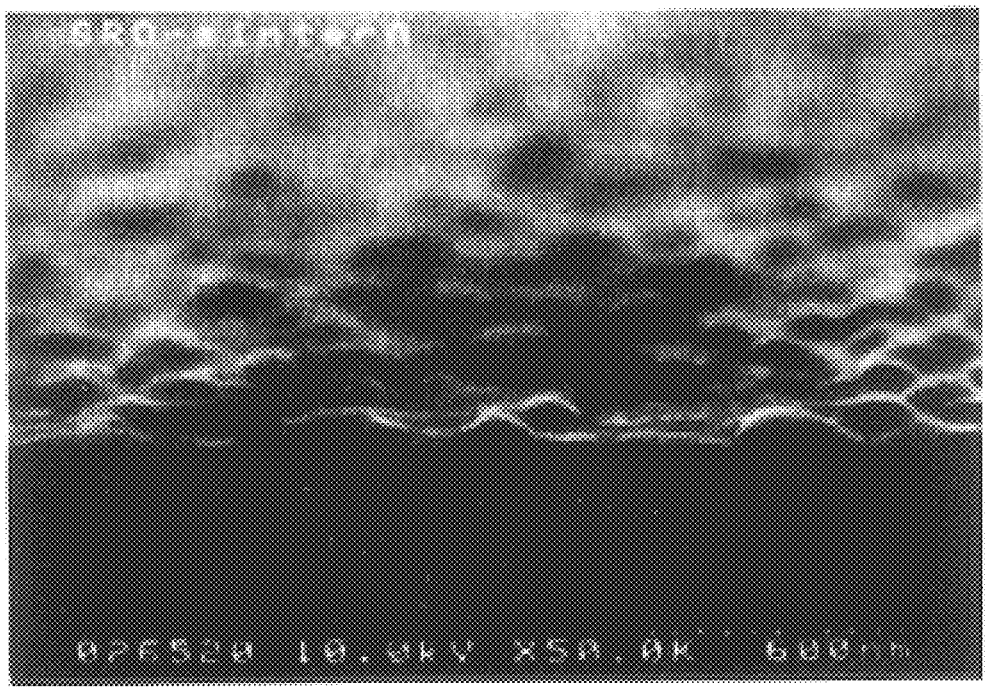
FIG. 5 is a SEM photograph showing a surface state of the capacitor opposing electrode after the sintering in the prior art.

In the prior art, if the SRO film is employed as the opposing electrode 9c of the capacitor 9, the sintering of the silicon substrate 1 is performed for 60 minutes at 400° C. by placing the silicon substrate 1 in the atmosphere of 3% $H_2$ and 97% $N_2$. Then, it can be seen that, as shown in the microphotograph of FIG. 4, ring-like patterns occur on the surface of the SRO film and thus the surface degradation is caused. A SEM photograph showing a surface state of the capacitor opposing electrode 9c after the sintering is shown FIG. 5. Unevenness is generated on the uppermost surface of the SRO film to cause the rough surface morphology. In this case, FIG. 4 is the microphotograph which is taken to extend twenty magnifications the natural size, while FIG. 5 is the SEM photograph which is taken to extend fifty thousand magnifications.

In contrast, following results have been derived according to the sintering according to the present embodiment.

In the present embodiment, if the SRO film is employed as the opposing electrode 9c of the capacitor 9, the sintering of the silicon substrate 1 is performed for 60 minutes at 400° C. by placing the silicon substrate 1 in the atmosphere of 3% $H_2$, about 97 (96.6 to 95.5)% $N_2$, and 0.4% to 1.5% $O_2$.

Figure 6:
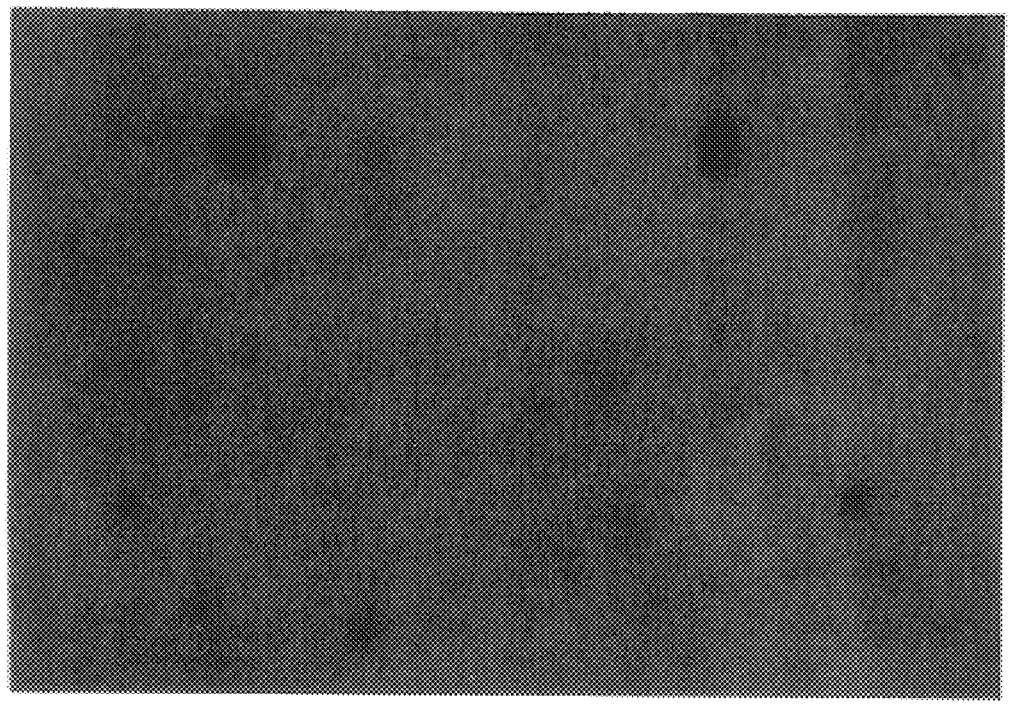
FIG. 6 is a microphotograph showing a surface state of a capacitor opposing electrode after the sintering according to the embodiment of the present invention.
Figure 7:
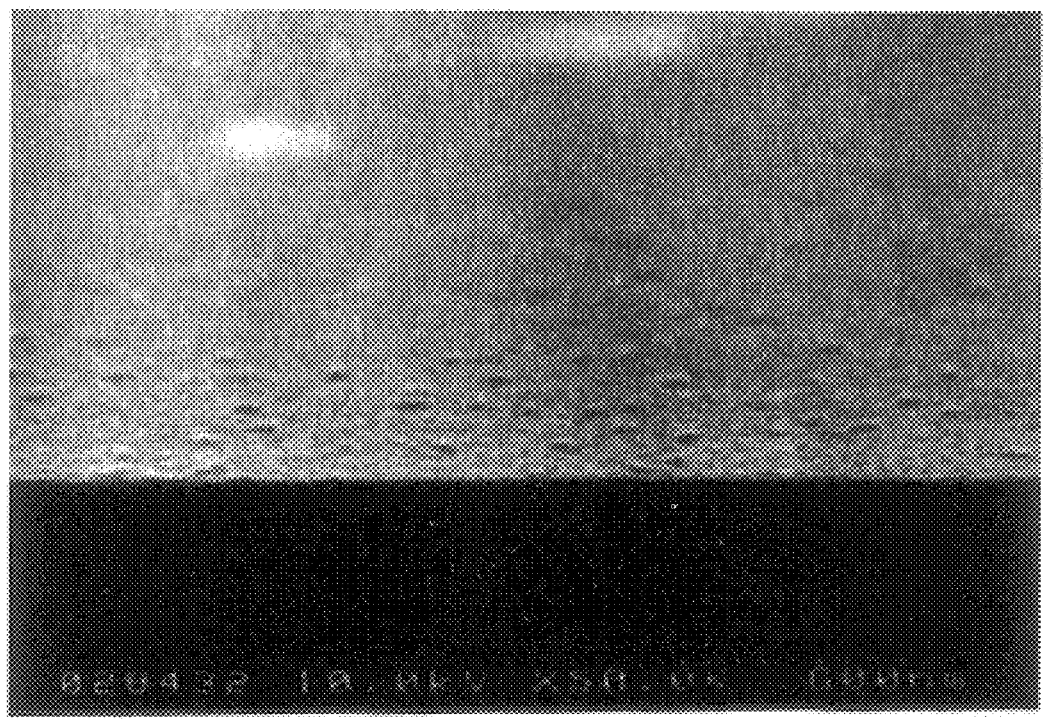
FIG. 7 is a SEM photograph showing a surface state of the capacitor opposing electrode after the sintering according to the embodiment of the present invention.

Then, as shown in a microphotograph shown in FIG. 6, the ring-like patterns are not shown on the surface of the SRO film and thus the good surface state is obtained. A SEM photograph showing the surface state of the capacitor opposing electrode 9c of the capacitor 9 after the sintering is shown FIG. 7. The uppermost surface of the SRO film becomes even and thus the surface morphology is not rough. In this case, FIG. 6 is the microphotograph which is taken to extend twenty magnifications the natural size, in which black spots are not generated on the surface of the SRO film but generated by the stain of the microscope. FIG. 7 is the SEM photograph which is taken to extend fifty thousand magnifications.

Next, the opposing electrode 9c formed of the SRO film is analyzed by the X-ray diffraction method.

Figure 8:
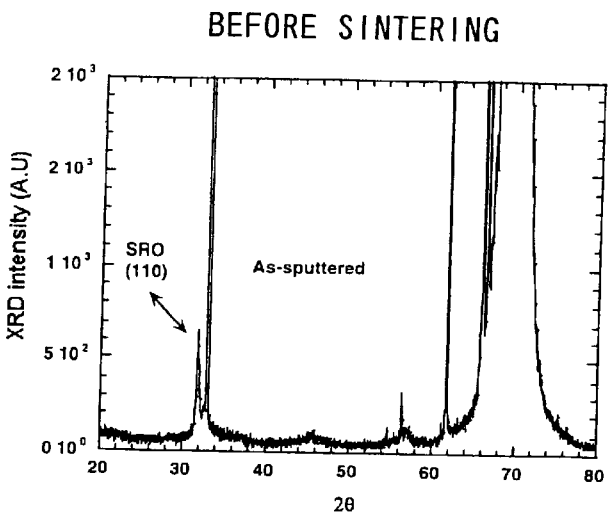
FIG. 8 is a view showing the analyzed result by the X-ray diffraction method before the sintering of the capacitor opposing electrode.

First, in the X-ray diffraction result obtained immediately after the SRO film is formed by the sputter method, as shown in FIG. 8, a peak appears at an angle indicating the feature of SRO (110) face.

Figure 9:
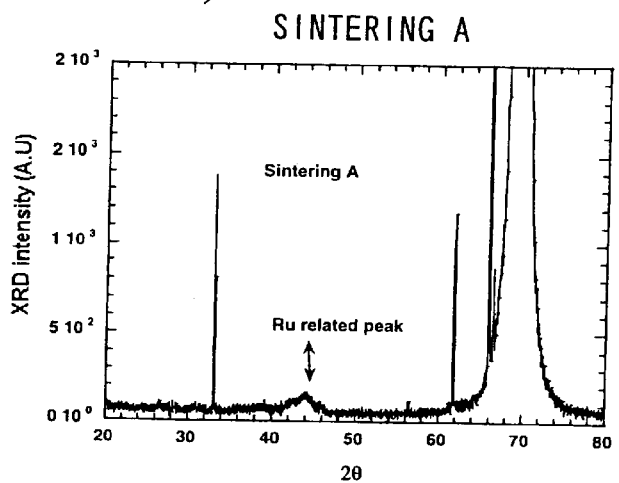
FIG. 9 is a view showing the analyzed result by the X-ray diffraction method after the sintering of the capacitor opposing electrode in the prior art.

However, the silicon substrate 1 is placed under the sintering condition in the prior art, i.e., in the atmosphere of 3% $H_2$ and 97% $N_2$ and then the sintering of the silicon substrate 1 is performed for 60 minutes at 400° C. Then, the result as shown in FIG. 9 has been derived. No peak appears at the angle indicating the feature of SRO, but a peak appears at an angle indicating the feature of ruthenium (Ru).

Figure 10:
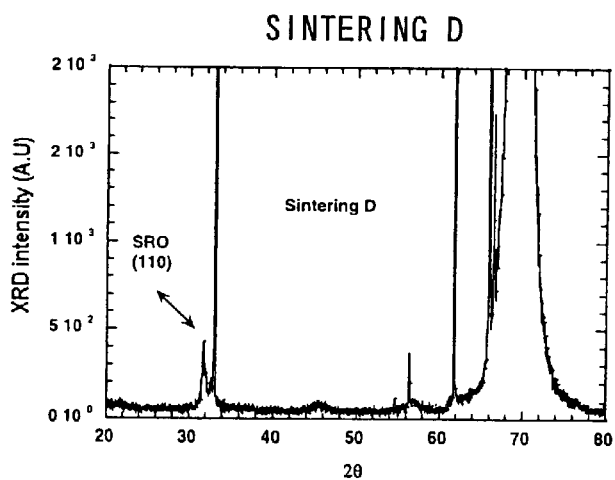
FIG. 10 is a view showing the analyzed result by the X-ray diffraction method after the sintering of the capacitor opposing electrode sintering according to the embodiment of the present invention.
Figure 11A:
FIGS. 11A and 11B are photographs showing difference in surfaces of the capacitor opposing electrode made of SRO film sintered under conditions in the prior art and the present invention respectively.
Figure 11B:
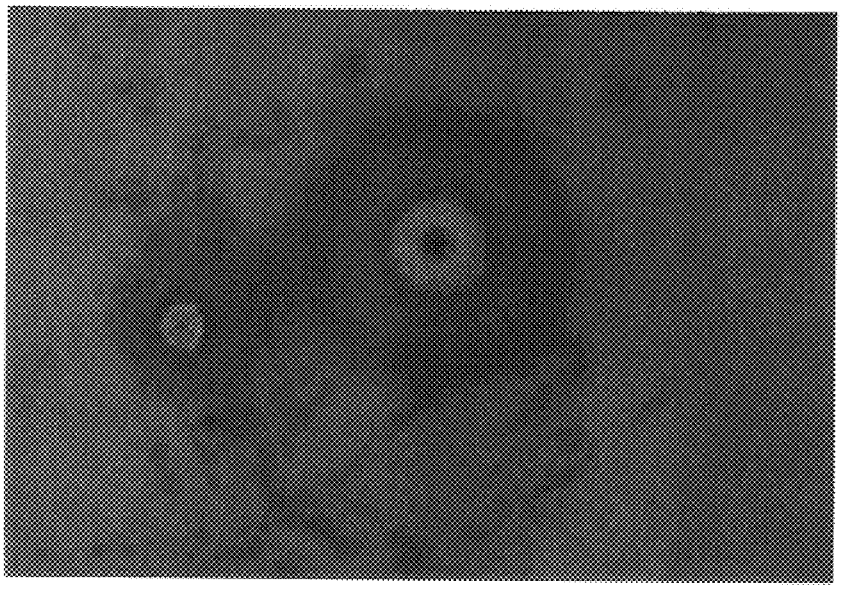

On the contrary, as discussed in the present embodiment, for example, the silicon substrate 1 is placed in the atmosphere of the mixed gas containing 3% $H_2$, about 97% $N_2$, and 0.4% to 1.5% $O_2$, and then the sintering of the silicon substrate 1 is performed for 60 minutes at 400° C. Then, as shown in FIG. 10, it can be seen that the peak appears at the angle indicating the feature of SRO (110) face, and therefore the change of the quality of the electrode after and before sintering seldom appears.

Next, how the leakage current of the capacitor 9 is changed according to the sintering and the difference of the sintering conditions will be explained hereunder. The experiments of such sintering have been made under conditions given in TABLE 1.

In the sintering condition C or D of the present invention in Table 1, the mixed gas which contains the oxygen at a flow rate ratio of 2% or 5% is introduced into the furnace 11 shown in FIG. 2, then the mixed gas of nitrogen and hydrogen is introduced from the gas introducing port 17 into the furnace 11 for 30 minutes or 20 minutes to maintain the pressure in the furnace 11 at the atmospheric pressure, and then the introduction of the mixed gas of the nitrogen and the hydrogen is stopped at the time point when the oxygen concentration in the furnace 11 is reduced to the capacity ratio n of 0.05% or 0.5%. The sintering of the silicon substrate 1 is carried out under such condition.

In contrast, in the sintering B, the oxygen has been introduced into the furnace 11, but the mixed gas of the nitrogen and the hydrogen is continuously supplied into the furnace 11 during the succeeding sintering. Therefore, the oxygen concentration around the silicon substrate at the time of sintering is reduced to 0.01% or less.

TABLE 1

| Sintering condition | surface morphology of SRO film (with naked eye) |
|---|---|
| Before sintering | very good |
| Sintering A (in the furnace) | |
| 1. pressure reduction to vacuum ($10^{-4}$ Pa) <br> 2. return to the normal pressure by introducing $N_2$ (970 sccm) + 3% $H_2$ (30 sccm) <br> 3. start the sintering <br> Condition: $N_2$ (970 sccm) + 3% $H_2$ (30 sccm) <br> Substrate heating temp. 400° C. <br> One hour | very bad |
| Sintering B (in the furnace) | |
| 1. pressure reduction to vacuum <br> 2. return to the normal pressure by introducing $N_2$ + 2% $O_2$ (30 sccm) <br> 3. supply $N_2$ (970 sccm) + 3% $H_2$ (30 sccm) for 30 minutes <br> 4. start the sintering <br> Condition: $N_2$ (970 sccm) + 3% $H_2$ (30 sccm) <br> Substrate heating temp. 400° C. <br> One hour <br> Oxygen ($O_2$) concentration estimation <br> Start 0.02 to 0.4% <br> End 0.0002 to 0.004% | bad |
| Sintering C | |
| 1. pressure reduction to vacuum <br> 2. return to the normal pressure by introducing $N_2$ + 2% $O_2$ <br> 3. supply $N_2$ (970 sccm) + 3% $H_2$ (30 sccm) for 30 minutes <br> 4. stop $N_2$ (970 sccm) + 3% $H_2$ (30 sccm) <br> 5. start the sintering <br> Condition: $N_2$ + 3% $H_2$ + n % $O_2$ <br> Substrate heating temp. 400° C. <br> One hour | good |
| Sintering D | |
| 1. pressure reduction to vacuum <br> 2. return to the normal pressure by introducing $N_2$ + 5% $O_2$ <br> 3. supply $N_2$ (970 sccm) + 3% $H_2$ (30 sccm) for 20 minutes <br> 6. stop $N_2$ (970 sccm) + 3% $H_2$ (30 sccm) <br> 7. start the sintering <br> Condition: $N_2$ + 3% $H_2$ + n % $O_2$ <br> Substrate heating temp. 400° C. <br> One hour | very good |

In the sintering condition of C or D given in TABLE 1, n is the numeral indicating the capacity ratio of the oxygen.

Figure 12A:
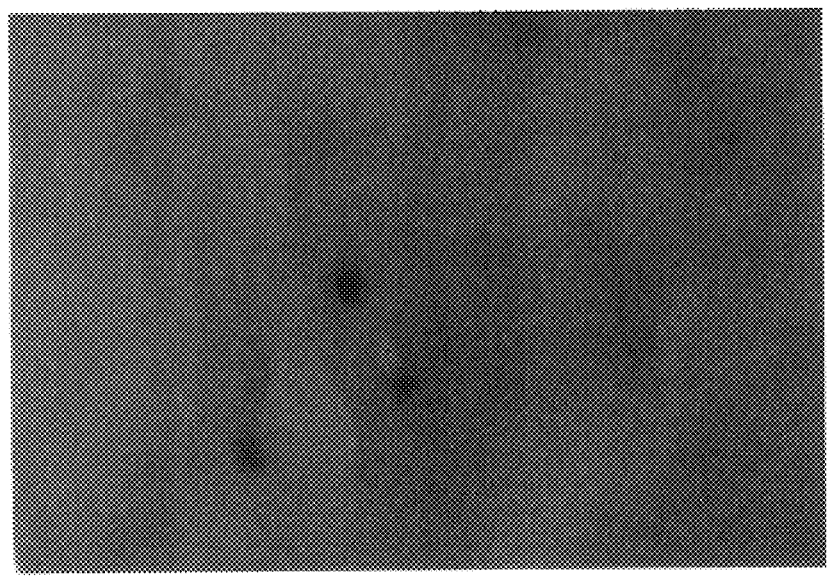
FIGS. 12A and 12B are photographs showing difference in surfaces of the capacitor opposing electrode made of an SRO film sintered under conditions of the present invention respectively.
Figure 12B:
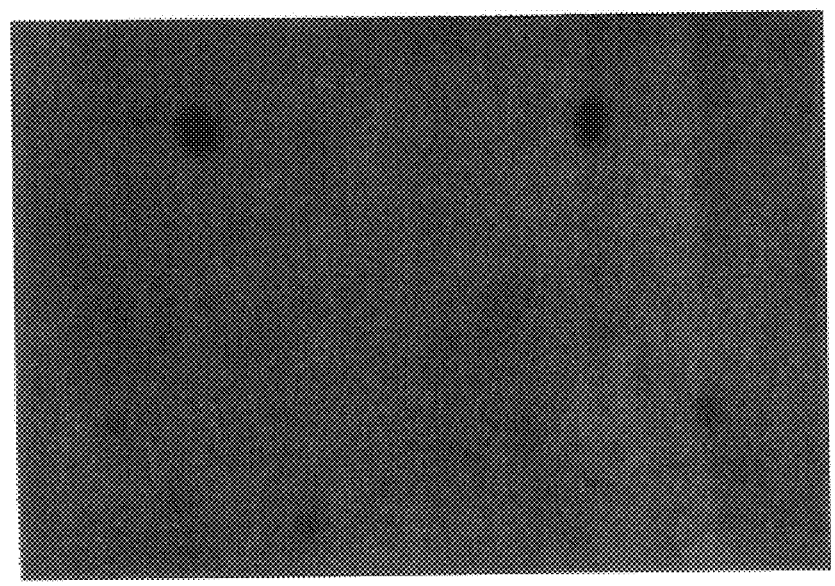
Figure 13A:
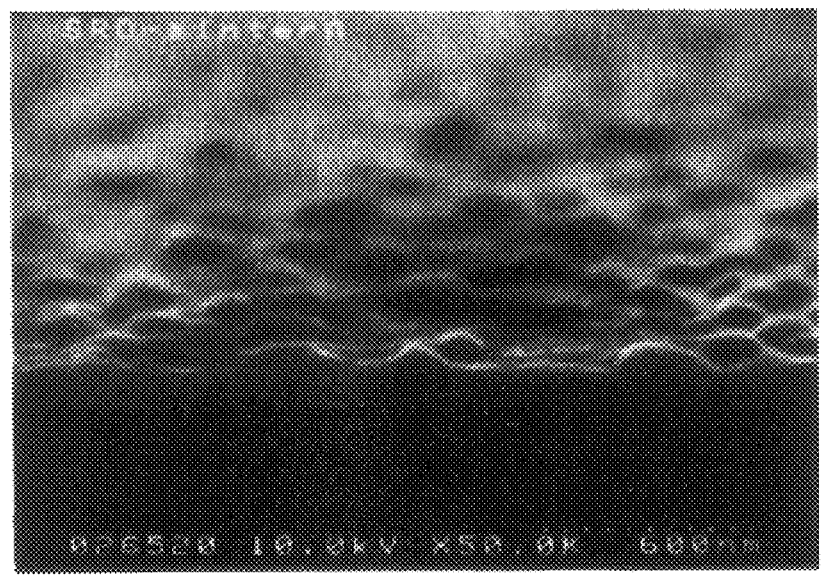
FIGS. 13A and 13B are SEM photographs showing difference of the capacitor opposing electrode made of an SRO film sintered under conditions in the prior art and the present invention respectively.
Figure 13B:
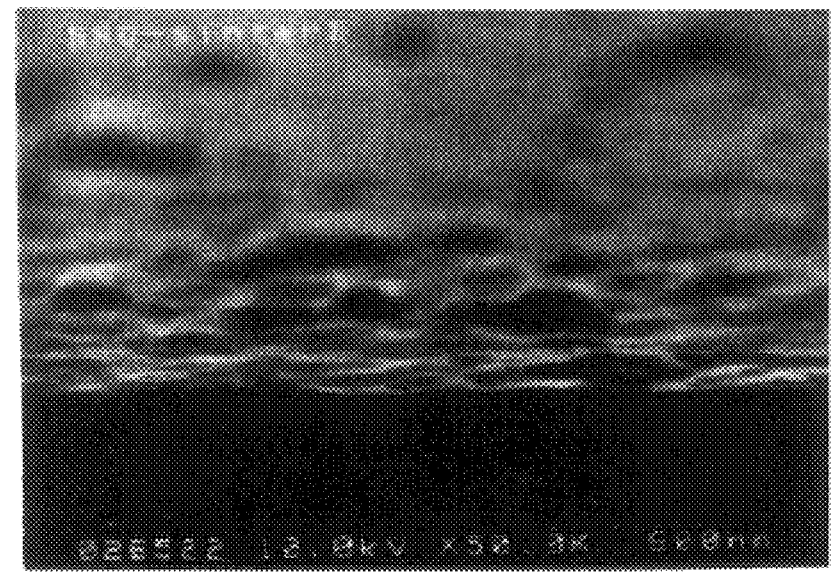
Figure 14A:
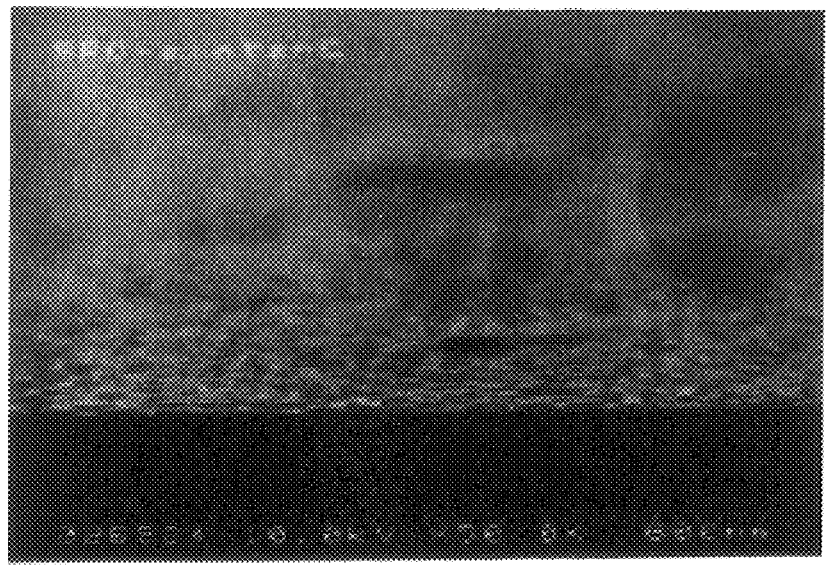
FIGS. 14A and 14B are SEM photographs showing difference of the capacitor opposing electrode made of an SRO film sintered under conditions of the present invention respectively.
Figure 14B:
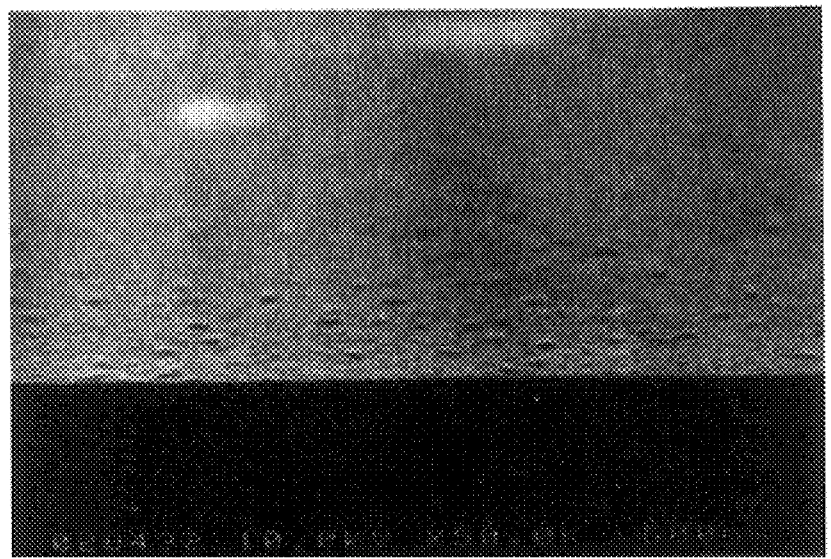

In TABLE 1, the surface morphology of the SRO film (opposing electrode) before the sintering is checked by the naked eye, and also the SRO film after the sintering A to D has been conducted is checked by the naked eye. Surface conditions of the SRO films after the sintering A to D are shown in photographs (twenty magnifications) of FIGS. 11A and 11B and FIGS. 12A and 12B. Thus, it can be seen that the better surface condition can be derived by introducing the oxygen. The black spots in the photographs of FIGS. 12A and 12B are caused by the microscope.

Besides, the SEM photographs of fifty thousand magnifications obtained after the sintering A to D have been performed are shown in FIGS. 13A and 13B and FIGS. 14A and 14B. It can be understood that the film quality of the SRO film is not degraded by the sintering using the forming gas containing the oxygen.

In the meanwhile, in TABLE 1, how the leakage current-voltage characteristic of the capacitor 9 is changed according to the sintering A in the prior art and the sintering D as an example of the present embodiment is checked based on the experiments. Then, results shown in FIG. 15 and FIG. 16 can be derived.

Figure 15:
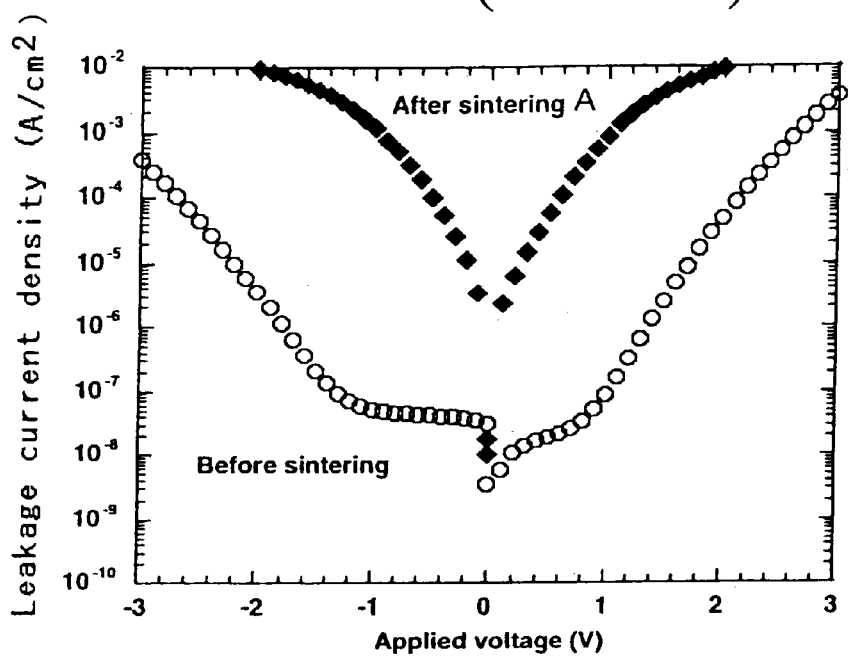
FIG. 15 is a view showing the leakage current-gate electrode characteristic of the capacitor sintered in the prior art.

After the sintering A as the prior art example, as shown in FIG. 15, the leakage current of the capacitor is increased rather than that before the sintering.

Figure 16:
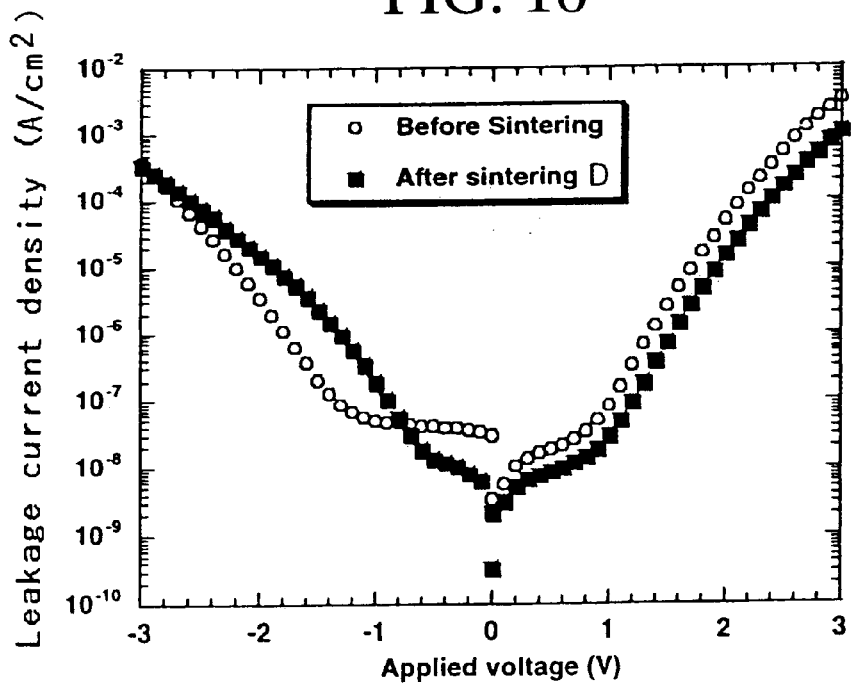
FIG. 16 is a view showing the leakage current-gate electrode characteristic of the capacitor sintered according to the present invention.

In contrast, according to the sintering D as the present embodiment, as shown in FIG. 16, the leakage current-voltage characteristic of the capacitor is almost similar before and after the sintering and thus the degradation of the capacitor due to the sintering is not found.

Also, it has been checked based on the experiments how the characteristics of the MOS transistor 3 is changed according to the sintering A under the prior art condition and the sintering D as an example of the present embodiment. Then, results shown in FIG. 17 and FIG. 18 can be derived. It can be seen that the transistor characteristics can be improved in both cases.

Figure 17:
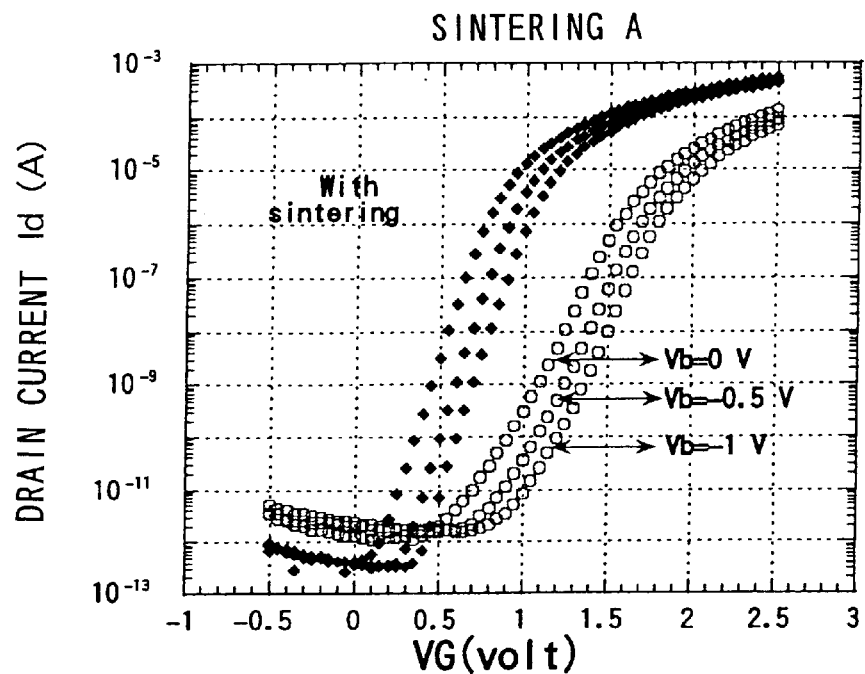
FIG. 17 is a view showing the gate voltage-drain current characteristic of the MOS transistor before and after the sintering in the prior art.
Figure 18:
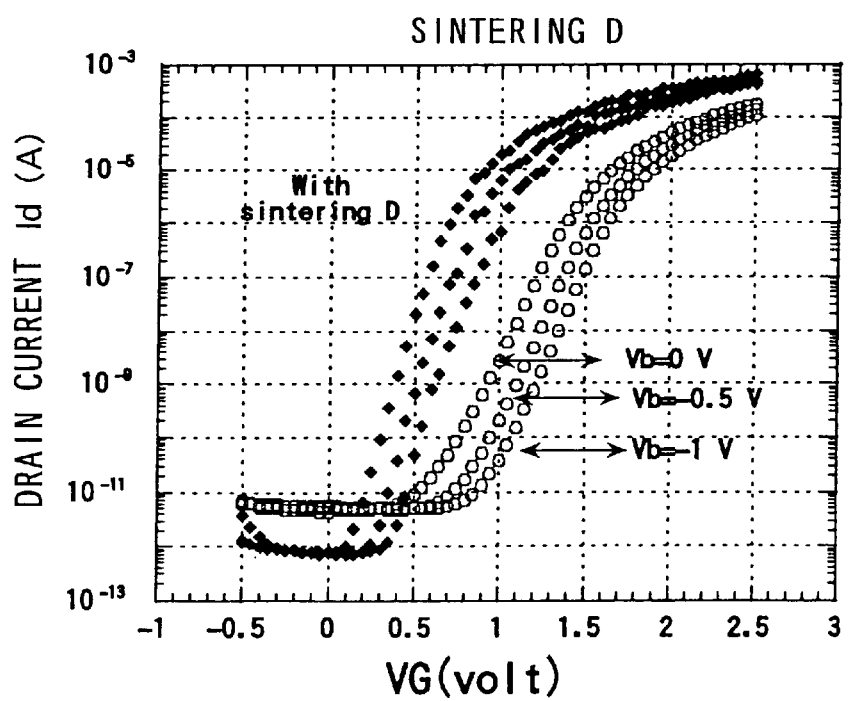
FIG. 18 is a view showing the gate voltage-drain current characteristic of the MOS transistor before and after the sintering according to the present invention.

The black marks in FIG. 17 and FIG. 18 denote the state after the sintering has been performed, whereas the white marks denote the state before the sintering is performed. In FIG. 17 and FIG. 18, Vb denotes an applied voltage applied to the gate electrode 3g. the source of the MOS transistor 3 is a ground potential and a constant voltage of 2.5 V, for example, is applied to the drain.

In the sintering performed to improve the transistor characteristics, heating of the silicon substrate 1 in the atmosphere of the mixed gas of the nitrogen, the hydrogen, and the oxygen is effective for preventing the increase in the leakage current of the capacitor 9 on the silicon substrate 1, nevertheless the improvement of the characteristics of the MOS transistor 3 cannot be achieved if the oxygen concentration exceeds 5%.

According to the experiments made by the inventor of the present invention, it is preferable that the oxygen concentration in the sintering atmosphere should be set to 0.01 to 5%. As a result, the degradation of the film quality of the capacitor can be prevented, the increase in the leakage current can be suppressed, and the characteristics of the MOS transistor can be improved. As the oxygen gas introduced into the furnace 11, either the oxygen ($O_2$) or ozone ($O_3$) or moisture ($H_2O$) may be employed. In this case, it is preferable that, in the furnace 11 at the time of the sintering, an ozone containing amount is set to the capacity ratio of 0.01% to 3% and a moisture containing amount is set to the capacity ratio of 0.01% to 5%.

As described above, according to the present invention, since the gas employed in sintering the semiconductor substrate is a mixed gas of nitrogen, hydrogen, and oxygen, the characteristics of the transistor formed on the semiconductor substrate can be improved and also degradation of the capacitor can be prevented.

What is claimed is:

1. A method of manufacturing a semiconductor device comprising the steps of:

providing a semiconductor substrate including a transistor, a capacitor having a lower electrode, a dielectric film and an upper electrode;

exhausting air from a furnace after the semiconductor substrate is placed in the furnace;

introducing a mixed gas containing hydrogen, nitrogen and at least one of oxygen, ozone and moisture to the furnace wherein the mixed gas is set to have a predetermined amount of oxygen concentration; and sintering the semiconductor substrate in the atmosphere of the mixed gas.

2. A method of manufacturing a semiconductor device according to claim 1, wherein the upper electrode of the capacitor is formed of one of $SrRu_xO_y$, $RuO_2$, Ru, and $TiO_xN_y$.

3. A method of manufacturing a semiconductor device according to claim 1, wherein the lower electrode of the capacitor is formed of one of doped-silicon, $SrRu_xO_y$, $RuO_2$, Ru, and $TiO_xN_y$.

4. A method of manufacturing a semiconductor device according to claim 1, wherein the dielectric film of the capacitor is formed of one of BST, $Ta_2O_5$, STO, PZT, PLZT, $Nb_2O_5$, and $TaTi_xO_y$.

5. A method of manufacturing a semiconductor device according to claim 4, wherein the electrode connected to the dielectric film is formed one of platinum, ruthenium, titanium nitride, and tungsten nitride.

6. A method of manufacturing a semiconductor device according to claim 1, wherein the oxygen contained in the mixed gas is in a range of 0.01% to 5%.

7. A method of manufacturing a semiconductor device according to claim 1, wherein sintering is performed at a heating temperature in a range of 300° C. to 600° C. for a time in a range of 90 minutes to 10 minutes.

8. A method of manufacturing a semiconductor device according to claim 7, wherein the time is set shorter when the heating temperature is set higher.

9. A method of manufacturing a semiconductor device according to claim 1, the hydrogen is 3%, the nitrogen is in a range 96.6% to 95.5%, and the oxygen is in a range 0.4% to 1.5%.

10. A method of manufacturing a semiconductor device according to claim 1, the semiconductor substrate is a silicon substrate.

11. A method of manufacturing a semiconductor device according to claim 1, the transistor is an MOS transistor.

12. A method of manufacturing a semiconductor device according to claim 1, the lower electrode is electrically contacted with the transistor.

13. A method of manufacturing a semiconductor device comprising the steps of:

providing a semiconductor substrate including a transistor, a capacitor having a lower electrode, a dielectric film and an upper electrode;

exhausting air from a furnace after a semiconductor substrate is placed in the furnace;

introducing a mixed gas containing hydrogen, nitrogen and at least one of oxygen, ozone and moisture to the furnace wherein the mixed gas is set to have a predetermined amount of oxygen concentration; and sintering the semiconductor substrate in the atmosphere of the mixed gas, whereby a characteristic of the transistor is improved without degrading a characteristic of the capacitor.

* * * * *